United States Patent
Ha et al.

(10) Patent No.: US 10,141,952 B2
(45) Date of Patent: Nov. 27, 2018

(54) MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Su-Hwang Jeong, Daejeon (KR); Dae-Sung Kim, Daejeon (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/279,028

(22) Filed: Sep. 28, 2016

(65) Prior Publication Data
US 2017/0272101 A1    Sep. 21, 2017

(30) Foreign Application Priority Data
Mar. 16, 2016 (KR) .................. 10-2016-0031490

(51) Int. Cl.
H03M 13/00    (2006.01)
H03M 13/15    (2006.01)
H03M 13/29    (2006.01)

(52) U.S. Cl.
CPC ....... H03M 13/15 (2013.01); H03M 13/2906 (2013.01); H03M 13/6566 (2013.01); H03M 13/152 (2013.01)

(58) Field of Classification Search
CPC .......................... H03M 13/15; H03M 13/6566
See application file for complete search history.

(56) References Cited

U.S. PATENT DOCUMENTS

| | | | |
|---|---|---|---|
| 2012/0221913 A1* | 8/2012 | Anholt | G06F 11/1012 714/752 |
| 2013/0132793 A1* | 5/2013 | Ha | H03M 13/2912 714/755 |
| 2016/0094246 A1* | 3/2016 | Vasista Srinivasan Ranganathan | H03M 13/1171 714/776 |

FOREIGN PATENT DOCUMENTS

KR    101320684    10/2013

OTHER PUBLICATIONS

Youm, H.Y., et al., The Decoding Algorithm of Binary BCH Codes using Symmetric Matrix, The Journal of Korean Institute of Communications and Information Sciences (J-KICS).
Choi, S. H., On the Decoding of BCH Codes Using Symmetric Matrix, Dept. of Information Communication Eng., Graduate School of Industrial Technology, Dong Eui University, Dec. 1997, pp. 1-37.
Pfister, H. et al., Symmetric Product Codes, Information Theory and Applications Workshop (ITA), Feb. 3, 2015, San Diego, CA, 2015, pp. 282-290.

(Continued)

*Primary Examiner* — Samir W Rizk
(74) *Attorney, Agent, or Firm* — IP & T Group LLP

(57) ABSTRACT

A memory system includes a memory device; and a controller suitable for encoding a message, storing the encoded message in the memory device and decoding the encoded message, wherein the controller is suitable for generating a message matrix including predetermined row codes and predetermined column codes symmetrical to the predetermined row codes, with the message or the encoded message using a block-wise concatenated Bose-Chadhuri-Hocquenghem (BCH) code with a symmetrical structure.

19 Claims, 10 Drawing Sheets

(56) References Cited

OTHER PUBLICATIONS

Pfister, H., et al., Symmetric Product Codes, Information Theory and Applications Workshop (ITA), Feb. 3, 2015, San Diego, CA, 2015, pp. 1-21.

Youm, H.Y., et al., The Decoding Algorithm of Binary BCH Codes using Symmetric Matrix, The Journal of Korean Institute of Communications and Information Sciences (J-KICS), Aug. 1989, pp. 374-387, vol. 14, No. 4.

* cited by examiner

MEMORY SYSTEM AND OPERATING METHOD THEREOF

CROSS-REFERENCE TO RELATED APPLICATIONS

The present application claims priority under 35 U.S.C. § 119(a) to Korean Patent Application No. 10-2016-0031490, filed on Mar. 16, 2016, which is incorporated herein by reference in its entirety.

BACKGROUND

1. Field

Exemplary embodiments of the present invention relate generally to a memory system and, more particularly, to a memory system performing encoding and decoding operations and an operation method thereof.

2. Description of the Related Art

Recently, for further increasing memory integration, memory systems (data storage devices), such as solid state drives (SSD), have started to employ a multi-level cell (MLC) based memory capable of storing two or more bits in a single memory cell.

However, as the number of bits programmable into a single memory cell increases, the error rate of a memory during a read operation may worsen due to interference between the multiple levels. The error rate may become rather substantial as program and read operations are repeated, thereby reducing the overall reliability of the memory system. To solve this problem, memory systems employ an error correction code.

Heretofore, well-known error correction codes include a hamming code, a Reed-Solomon code, a Bose-Chaudhuri-Hocquenghem (BCH) code, and a block-wise concatenated BCH (BC-BCH) code comprising the BCH code as a constituent code. The BC-BCH code is a strong error correction code, having a high code rate and a low error rate. However, the BC-BCH code has a deficiency in that the error floor occurs in a high signal to noise ratio (SNR). In general, a (1, 1) error pattern representing failure of a single row parity and a single column parity has a substantial influence on the error floor. That is, as the size of a block becomes greater, the probability of increasing the number of error patterns increases and thus the probability of the error floor also increases in the block. Downsizing of the block may be a solution for the problem, however, downsizing of the block may require increasing the number of the constituent codes, which cause lowered error rate.

SUMMARY

Various embodiments of the present invention are directed to an error correction code having a symmetrical structure, a memory system performing encoding and decoding operations with the error correction code, and an operation method of the memory system.

In accordance with an embodiment of the present invention, a memory system may include: a memory device; and a controller suitable for encoding a message, storing the encoded message in the memory device and decoding the encoded message. The controller may be suitable for generating a message matrix including predetermined row codes and predetermined column codes symmetrical to the predetermined row codes, with the message or the encoded message using a block-wise concatenated Bose-Chadhuri-Hocquenghem (BCH) code with a symmetrical structure.

The controller may divide the message into a plurality of message blocks.

The controller may divide the encoded message into a plurality of encoded message blocks and a plurality of parity blocks.

The message matrix may include a first triangular matrix and a second triangular matrix symmetrical to the first triangular matrix.

The first triangular matrix may be generated using the plurality of message blocks.

The second triangular matrix may be generated using the plurality of message blocks so that the second triangular matrix is symmetrical to the first triangular matrix.

The first triangular matrix may be generated using the plurality of encoded message blocks and the plurality of parity blocks.

The second triangular matrix may be generated using the plurality of encoded message blocks so that the second triangular matrix is symmetrical to the plurality of encoded message blocks of the first triangular matrix.

In accordance with an embodiment of the present invention, an operation method of a memory system including a host, the controller and a memory device, the operation method may include: receiving a message from the host; dividing the received message into a plurality of message blocks; generating a first triangular matrix and a second triangular matrix symmetrical to the first triangular matrix using the plurality of message blocks; generating a message matrix by combining the first triangular matrix and the second triangular matrix; performing an encoding operation to the message matrix; and generating an encoded message by obtaining the first triangular matrix and a plurality of parity blocks from the encoded message matrix.

The message matrix may include a block-wise concatenated Bose-Chadhuri-Hocquenghem (BCH) code, and may include predetermined row codes and predetermined column codes symmetrical to the predetermined row codes.

The message matrix may have an anti-symmetric structure where a plurality of zero padding blocks are included between the first triangular matrix and the second triangular matrix.

The message matrix may have a shortening structure where a plurality of zero padding blocks are not included between the first triangular matrix and the second triangular matrix.

The encoding operation may be performed to respective row codes of the message matrix to generate a parity block corresponding to the respective row codes.

The second triangular matrix may be symmetrical to the first triangular matrix in the encoded message matrix.

The operation method may further include: storing the encoded message in the memory device.

In accordance with an embodiment of the present invention, an operation method of a memory system including a host, the controller and a memory device, the operation method may include: reading an encoded message from the memory device; dividing the encoded message into a plurality of encoded message blocks and a plurality of parity blocks; generating a first triangular matrix and a second triangular matrix symmetrical to the first triangular matrix using the plurality of encoded message blocks and the plurality of parity blocks; generating a message matrix by combining the first triangular matrix and the second triangular matrix; performing a decoding operation to the message matrix; and generating a decoded message by obtaining the first triangular matrix from the decoded message matrix.

The message matrix may include a block-wise concatenated Bose-Chadhuri-Hocquenghem (BCH) code, and includes predetermined row codes and predetermined column codes symmetrical to the predetermined row codes.

The message matrix may have an anti-symmetric structure where a plurality of zero padding blocks are included between the first triangular matrix and the second triangular matrix.

The message matrix may have a shortening structure where a plurality of zero padding blocks are not included between the first triangular matrix and the second triangular matrix.

Performing the decoding operation to the message matrix may include: generating a first decoding result by performing the decoding operation to a first row code of the message matrix; updating a first column code, which is symmetrical to the first row code, by transmitting the first decoding result to the first column code; and repeating the generating of the first decoding result and the updating the first column code a predetermined number of times until the first row code in the message matrix becomes a last row code.

BRIEF DESCRIPTION OF THE DRAWINGS

These and other features and/or advantages of the present invention will become apparent to those skilled in the art to which this invention belongs in view of the following description of various embodiments of the present invention in reference to the accompanying drawings in which.

DETAILED DESCRIPTION

Figure 1:
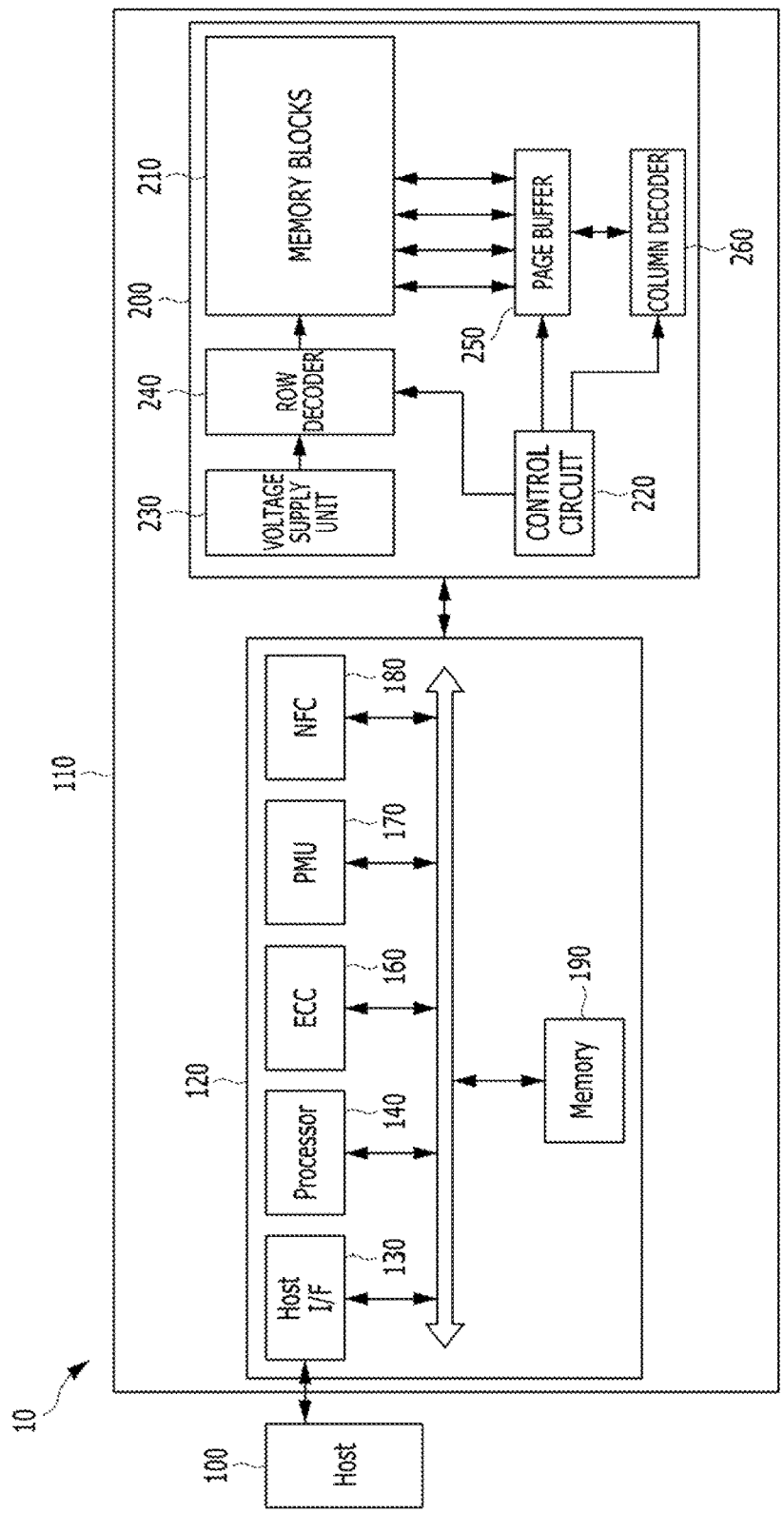
FIG. 1 is a block diagram illustrating a semiconductor memory system, in accordance with an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete and will fully convey the present invention to those skilled in the art. The drawings are not necessarily to scale and in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

In general, a nonvolatile memory device such as a flash memory device includes a plurality of memory blocks, each of which is a unit of erase operation. Each memory block has pages, each of which is a unit of read and write operations. Therefore, it is preferable to perform the error correction operation with an error correction code by a unit of page. In general, in a typical flash memory, a size of the page may be 1 KB in a single level cell (SLC) structure, and 4 KB or 8 KB in a multi-level cell (MLC) structure.

A flash memory device as a storage device requires high reliability, and should operate at a very low error rate when an error correction code is applied. Also, a flash memory device has a limited delay time and complexity for any encoding and decoding operations for achieving fast read and write speeds. Also, a flash memory device has a limited ratio of parity bits to a whole storage data due to a limited extra space other than data storage space for efficiency of the storage space. Therefore, an error correction code suitable for a flash memory device should have a high code rate (e.g., over 0.9), and should not cause an error floor, or if causing an error floor, should have sufficiently short delay time and low complexity for overcoming the error floor.

Hereinafter, various embodiments of the present invention may be applied to a concatenated BCH code having a BCH code as a constituent code or a single BCH code. Hereinafter, various embodiments of the present invention will be described with the concatenated BCH code. The concatenated BCH code may be a block-wise concatenated BCH (BC-BCH) code.

Hereinafter, various embodiments of the present invention will be described with reference to the accompanying figures.

FIG. 1 illustrates a data processing system 10 including a semiconductor memory system 110, in accordance with an embodiment of the present invention.

According to the embodiment of FIG. 1, the data processing system 10 may also include a host 100 coupled to the memory system 110.

The host 100 may include, for example, a portable electronic device, such as a mobile phone, an MP3 player, and a laptop computer or a non-portable electronic device such as a desktop computer, a game player, a television (TV), a projector and the like.

The memory system 110 may operate in response to a request of the host 100. The memory system 110 may store data to be accessed by the host 100. For example, the memory system 110 may be used as a main memory system or an auxiliary memory system of the host 100. The memory system 110 may be implemented with any one of various storage devices, according to the protocol of a host interface to be electrically coupled with the host 100. The memory system 110 may be implemented with any one of storage devices, such as, for example, a solid-state drive (SSD), a multimedia card (MMC), an embedded MMC (eMMC), a reduced-size MMC (RS-MMC) and a micro-MMC, a secure digital (SD) card, a mini SD card, a micro SD card, a universal serial bus (USB) storage device, a universal flash storage (UFS) device, a compact flash (CF) card, a smart media (SM) card, a memory stick, and the like.

The storage device for the memory system 110 may be implemented with a volatile memory device, such as, for example, a dynamic random access memory (DRAM) and a static random access memory (SRAM). The storage device for the memory system 110 may be implemented with a nonvolatile memory device, such as, for example, a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), a resistive RAM (RRAM), and the like. One or more storage devices may be used.

The memory system 110 may include a memory device 200 which may store data to be accessed by the host 100, and a controller 120 for controlling the operations of the memory device 200 including storage of data received from the host 100 to the memory device 200.

The controller 120 and the memory device 200 may be integrated into a semiconductor device configured as a memory card. For instance, the controller 120 and the memory device 200 may be integrated into a semiconductor device configured as a solid state drive (SSD). When the memory system 110 is used as a SSD, the operation speed of the host 100 that is electrically coupled with the memory system 110 may be significantly increased.

The controller 120 and the memory device 200 may be integrated into a semiconductor device configured as a memory card. For example, the controller 120 and the memory device 200 may be integrated into a semiconductor device configured as any one of a memory card, such as, for example, a personal computer memory card international association (PCMCIA), a compact flash (CF) card, a smart media (SM) card (SMC), a memory stick, a multimedia card (MMC), a reduced-size (RS)MMC, a micro-MMC, a secure digital (SD) card, a mini-SD SD card, a micro-SD card, a secure digital high capacity (SDHC), a universal flash storage (UFS) device, and the like.

In an embodiment, the memory system 110 may be or include a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, one of various component elements configuring a computing system, and the like.

The memory device 200 of the memory system 110 may retain stored data even when power supply is interrupted. The memory device 200 may store the data provided from the host 100 through a write operation, and provide stored data to the host 100 through a read operation.

The memory device 200 of the memory system 110 may include a plurality of memory blocks 210, a control circuit 220, a voltage supply unit 230, a row decoder 240, a page buffer 250, and a column decoder 260. For example, the memory device 200 may be a nonvolatile memory device such as the flash memory device. The flash memory device may have a 3-dimensional (3D) stacked structure.

Each of the memory blocks 210 may include a plurality of pages. Each of the pages may include a plurality of memory cells to which a plurality of word lines (WL) are electrically coupled.

The control circuit 220 may control the various operations of the memory device 200, such as, for example, program, erase, and read operations.

The voltage supply unit 230 may provide word lines voltages, such as, for example, a program voltage, a read voltage, and a pass voltage, to the respective word lines according to an operation mode. The voltage supply unit 230 may provide a voltage to be supplied to a bulk (e.g., a well region), in which the memory cells are formed. A voltage generating operation of the voltage supply circuit 230 may be performed under the control of the control circuit 220. The voltage supply unit 230 may generate a plurality of variable read voltages for generation of a plurality of read data.

The row decoder 240 may select one of the memory blocks or sectors of the memory blocks 210, and may select one among the word lines of the selected memory block under the control of the control circuit 220. The row decoder 240 may provide the word line voltage generated from the voltage supply circuit 230 to selected word lines or non-selected word lines under the control of the control circuit 220.

During a program operation, the page buffer 250 may operate as a write driver for driving the bit lines according to data to be stored in the memory blocks 210. For example, during a program operation, the page buffer 250 may receive the data to be written in the memory blocks 210 from a buffer (not illustrated), and may drive the bit lines according to the received data. The page buffer 250 may include a plurality of page buffers (not shown) corresponding to the columns or the bit lines, or column pairs or bit line pairs, respectively. A plurality of latches may be included in each of the plurality of page buffers.

The controller 120 of the memory system 110 may control the memory device 200 in response to a request from the host 100. The controller 120 may provide the data read from the memory device 200, to the host 100. The controller 120 may store the data from the host 100 into the memory device 200. To this end, the controller 120 may control the overall operations such as, for example, read, write, program and erase operations of the memory device 200.

The controller 120 may include a host interface unit 130, a processor 140, an error correction code (ECC) unit 160, a power management unit (PMU) 170, a NAND flash controller (NFC) 180, and a memory 190.

The host interface 130 may process a command and data from the host 100 and may communicate with the host 100 through at least one of various interface protocols, such as, for example, a universal serial bus (USB), a multi-media card (MMC), a peripheral component interconnect express (PCI-E), a serial-attached SCSI (SAS), a serial advanced technology attachment (SATA), a parallel advanced technology attachment (PATA), a small computer system interface (SCSI), an enhanced small disk interface (ESDI), an integrated drive electronics (IDE), and the like.

The ECC unit 160 may detect and correct errors in data read from the memory device 200 during the read operation. The ECC unit 160 may perform the ECC decoding on the data read from the memory device 200, determine whether or not the ECC decoding succeeds, output an instruction signal according to the determination result, and correct error bits of the read data using parity bits generated during the ECC encoding. The ECC unit 160 may not correct error bits when the number of the error bits is greater than or equal to a threshold number of correctable error bits, and may output an error correction fail signal indicating failure in correcting the error bits.

The ECC unit 160 may perform an error correction operation based on any one of a coded modulation, such as, for example, a low density parity check (LDPC) code, a Bose-Chaudhuri-Hocquenghem (BCH) code, a turbo code, a Reed-Solomon (RS) code, a convolution code, a recursive systematic code (RSC), a Trellis-coded modulation (TCM), a block coded modulation (BCM), and the like. The ECC unit 160 may include all circuits, systems or devices needed for the error correction operation.

The PMU 170 may provide and manage power for the controller 120. For example, the PMU 170 may provide and manage power for the component elements included in the controller 120. The PMU unit 170 may include all circuits, systems or devices needed.

The NFC 180 may serve as a memory interface between the controller 120 and the memory device 200 to allow the controller 120 to control the memory device 200 in response to a request from the host 100. The NFC 180 may generate control signals for the memory device 200 and process data under the control of the processor 140 when the memory device 200 is a flash memory and, in particular, when the memory device 200 is a NAND flash memory. Any suitable memory interface may be employed depending upon the particular memory device 200.

The memory 190 may serve as a working memory of the memory system 110 and the controller 120, and store data for driving the memory system 110 and the controller 120. The controller 120 may control the memory device 200 in response to a request from the host 100. For example, the controller 120 may provide the data read from the memory device 200 to the host 100, and may store the data provided from the host 100 in the memory device 200. When the controller 120 controls the operations of the memory device 200, the memory 190 may store data used by the controller 120 and the memory device 200 for such operations as read, write, program and erase operations.

The memory 190 may be implemented with a volatile memory. For example, the memory 144 may be implemented with a static random access memory (SRAM) or a dynamic random access memory (DRAM). As described above, the memory 190 may store data used by the host 100 and the memory device 200 for the write and read operations. To store data, the memory 190 may include a program memory, a data memory, a write buffer, a read buffer, a map buffer, and the like.

Additionally, the memory 190 may store data for operations between the ECC unit 160 and the processor 140, such as, for example, data that is read during read operations. That is, the memory 190 may store data read from the semiconductor memory device 200. The data may include user data, parity data and status data. The status data may include information of which cycling group is applied to the memory blocks 210 of the semiconductor memory device 200 during the program operation.

The processor 140 may control the operations of the memory system 110, and a write operation or a read operation for the memory device 200, in response to a write request or a read request from the host 100. The processor 140 may drive firmware, which is referred to as a flash translation layer (FTL), to control the general operations of the memory system 110. The processor 140 may be implemented with a microprocessor or a central processing unit (CPU).

A management unit (not shown) may be included in the processor 140, and may perform bad block management of the memory device 200. The management unit may find bad memory blocks included in the memory device 200, which are in unsatisfactory condition for further use, and perform bad block management on the bad memory blocks. When the memory device 200 is a flash memory (e.g., a NAND flash memory), a program failure may occur during the write operation (i.e., the program operation), due to characteristics of a NAND logic function. During the bad block management, the data of the program-failed memory block or the bad memory block may be programmed into a new memory block. Also, the bad blocks due to the program fail seriously deteriorate the utilization efficiency of the memory device 200 having a 3D stack structure and the reliability of the memory system 110, and thus reliability bad block management is required.

Figure 2:
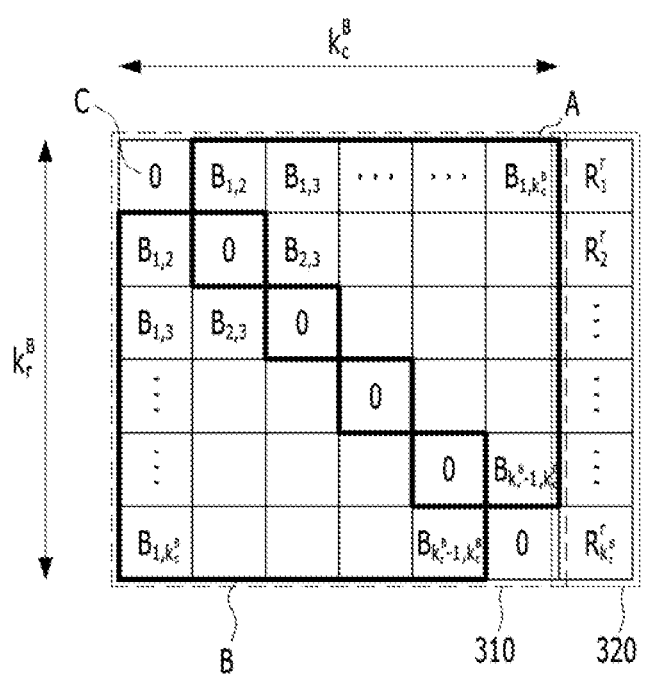
FIG. 2 is a diagram illustrating a block-wise concatenated BCH (BC-BCH) code having a symmetrical structure.

FIG. 2 illustrates a block-wise concatenated BCH (BC-BCH) code having a symmetrical structure.

Referring to FIG. 2, a matrix comprising constituent codes may include a message matrix 310, which is generated from a message, and a row parity 320 concatenated to the message matrix 310.

FIG. 2 exemplifies the row parity 320 concatenated to the message matrix 310 in parallel. However, in case of the row parity 320 serially concatenated to the message matrix 310, the row parity 320 may be included in row message block. Therefore, both lengths of the message and the row parity 320 should be considered for the generation of the message matrix 310.

The message matrix 310 may be generated through application of one of the hamming code, the Reed-Solomon code, and the Bose-Chaudhuri-Hocquenghem (BCH) code. For example, the message matrix 310 may be generated as the block-wise concatenated BCH (BC-BCH) code having the BCH code as the constituent code. The message matrix 310 as the block-wise concatenated BCH (BC-BCH) code may include a plurality of message blocks of symmetrical structure. That is, the message matrix 310 may be generated as a symmetric block-wise concatenated BCH (SBC-BCH) code.

For example, the message matrix 310 may include an A region having a plurality of message blocks, a B region having a plurality of message blocks symmetrical to the plurality of message blocks of the A region, and a plurality of zero padding blocks on the boundary between the A region and the B region. The plurality of zero padding blocks C may be a plurality of diagonal message blocks $B_{(i, j)}$, where i=j, among the plurality of message blocks $B_{(i, j)}$, where "i" represents row and "j" represents column.

Total length of whole messages in the message matrix 310 may be "K", a length of a message of each constituent code may be "k", and a size of each message block $B_{(i, j)}$ (i.e., a number of bits included in each message block $B_{(i, j)}$) may be "$N_B$", where $N_B$ is a natural number. A number of row codes may be $k_r^B$ and a number of column codes may be $k_c^B$ in the message matrix 310. The numbers of the row codes $k_r^B$ and the column codes $k_c^B$ may be the same (i.e., $k_r^B = k_c^B$). Each row code may include $k_c^B$ message blocks and one or more (e.g., $$R^r_{k_r^B}$$

numbers) parity blocks. Each column code may include $k_r^B$ message blocks.

A message block of an i-th row code in the message matrix 310 may be protected by a single row parity block regardless of the parallel or serial concatenation. The row parity block may include parity information for the message block of the i-th row code.

The total length "K" of whole messages in the message matrix 310 may be represented by the following equation 1.

[Equation 1]

$$K = N_B \times ((k_c^B - 1) + (k_c^B - 2) + \ldots + 1) \quad (1)$$

In the equation 1, $((k_c^B-1)+(k_c^B-2)+ \ldots +1)$ represents a number of message blocks included in the A region or the B region, and "$N_B$" represents the size of each message block $B_{(i, j)}$ (i.e., a number of bits included in each message block $B_{(i, j)}$). Also, since the message matrix 310 is the symmetric block-wise concatenated BCH (SBC-BCH) code, the total length "K" of whole messages in the message matrix 310 may be obtained from the number $((k_c^B-1)+(k_c^B-2)+ \ldots +1)$ of message blocks included in the A region or the B region.

The length "k" of each row code may be represented by the following equation 2.

[Equation 2]

$$k = N_B \times k_c^B \quad (2)$$

In equation 2, the size "$N_B$" of each message block $B_{(i, j)}$ may be represented by the following equations 3 and 4. Equation 3 may be obtained from equation 1 and equation 4 may be obtained from equation 2.

[Equation 3]

$$N_B = \frac{2K}{k_c^B \times (k_c^B - 1)} \quad (3)$$

[Equation 4]

$$N_B = \frac{k}{k_c^B} \quad (4)$$

The number $k_r^B$ of the row codes may be represented by the following equation 5.

[Equation 5]

$$k_r^B = \left(\frac{2K}{k}\right) + 1 \quad (5)$$

The length "k" of each row code may also be represented by the following equation 6.

[Equation 6]

$$k = (N_B \times k_r^B) \quad (6)$$

The number $k_c^B$ of the column codes may be represented by the following equation 7.

[Equation 7]

$$k_c^B = \left(\frac{2K}{k}\right) + 1 \quad (7)$$

Figure 3:
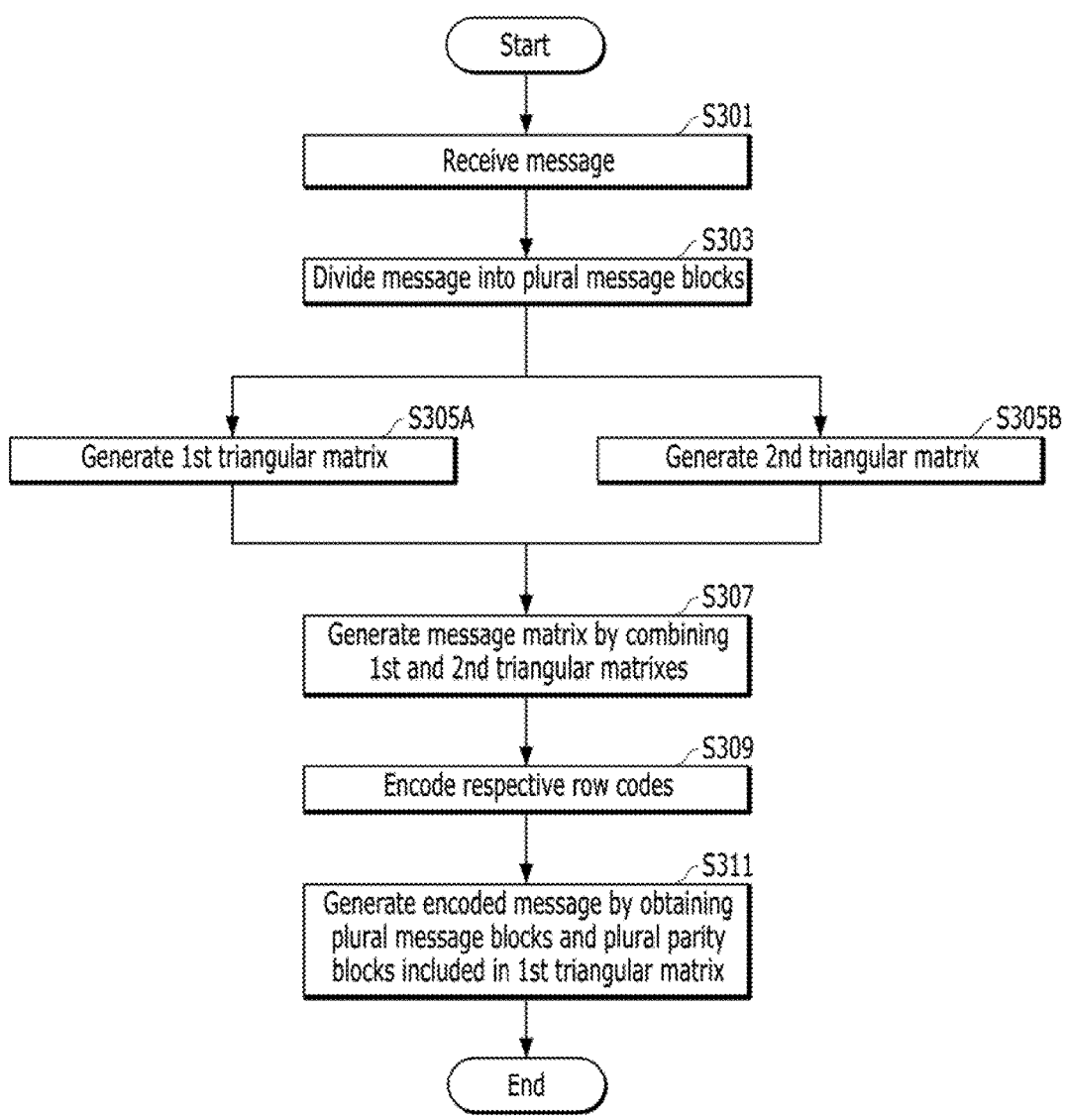
FIG. 3 is a flowchart illustrating an encoding operation of a memory system, in accordance with a first embodiment of the present invention.

FIG. 3 is a flowchart of an encoding operation of a memory system, in accordance with a first embodiment of the present invention. For example, the operation of FIG. 3 may be performed by the ECC unit 160 included in the controller 120 of FIG. 1.

A message provided from the host 100 to the controller 120 may be the symmetric block-wise concatenated BCH (SBC-BCH) code. The symmetric block-wise concatenated BCH (SBC-BCH) code may have two kinds of constituent codes, which are respectively referred to as the row code and the column code.

At step S301, the controller 120 may receive a message from the host 100.

At step S303, the controller 120 may divide the message into a plurality of message blocks according to a designed code. For example, the controller 120 may divide the message provided from the host 100 into a plurality of message blocks. The plurality of message blocks representing the message may, for example, include a first message block, a second message block, a third message block, a fourth message block, a fifth message block and a sixth message block in sequence.

At step S305A, the controller 120 may generate a first triangular matrix by using the plurality of message blocks. The first triangular matrix may have a stepped structure. For example, the controller 120 may generate the first triangular matrix by arranging the first to sixth message blocks in the row direction. The first triangular matrix may include the first message block, the second message block and the third message block in a first row code; the fourth message block and the fifth message block in a second row code; and the sixth message block in a third row code. The generated first triangular matrix may be stored in a first buffer (not shown) of the ECC unit 160.

At step S305B, the controller 120 may generate a second triangular matrix by using the plurality of message blocks. The second triangular matrix may have a stepped structure. The second triangular matrix may be symmetrical to the first triangular matrix. For example, the controller 120 may generate the second triangular matrix by arranging the first to sixth message blocks in the column direction. The second triangular matrix may include the first message block, the second message block and the third message block in a first column code; the fourth message block and the fifth message block in a second column code; and the sixth message block in a third column code. The generated second triangular matrix may be stored in a second buffer (not shown) of the ECC unit 160. In an embodiment, the first triangular matrix and the second triangular matrix may be generated at the same time. In another embodiment, the first triangular matrix may be generated and then the second triangular matrix may be generated. In another embodiment, the second triangular matrix may be generated and then the first triangular matrix may be generated.

At step S307, the controller 120 may generate a single message matrix by combining the first triangular matrix and the second triangular matrix. Numbers of the row codes and column codes in the message matrix may be the same as each other. The generated message matrix may be stored in a third buffer (not shown) of the ECC unit 160. The message matrix may have an anti-symmetric structure or a shortening structure. In some embodiments, the message matrix having the anti-symmetric structure (e.g., FIG. 2) may have a plurality of zero padding blocks (e.g., C region), each of which is padded with zero-valued bits, on diagonal boundary between the first triangular matrix (e.g., A region) and the second triangular matrix (e.g., B region) when combining the first triangular matrix and the second triangular matrix. Alternatively, the message matrix having the shortening structure may have the first triangular matrix and the second triangular matrix without the zero padding blocks. That is, the message matrix having the shortening structure may not have the plurality of zero padding blocks, each of which is padded with zero-valued bits, on diagonal boundary between the first triangular matrix and the second triangular matrix when combining the first triangular matrix and the second triangular matrix. The message matrix having the anti-symmetric structure as shown in FIG. 2 may be taken as an example in this disclosure.

At step S309, the controller 120 may generate the parity block corresponding to the respective row codes by performing the encoding operation to the respective row codes of the message matrix. For the encoding operation to the plurality of message blocks (e.g., 6 message blocks BLOCK1 to BLOCK6) included in the message matrix, the controller 120 may generate the parity block in parallel by performing the encoding operation in the row-direction to the plurality of message blocks included in the respective row codes. For example, as shown in FIG. 2, a first row code may include a first zero padding block, the first message block, the second message block, and the third message block, which are encoded, and a first parity block. A second row code may include the first message block, a second zero padding block, the fourth message block, and the fifth message block, which are encoded, and a second parity block. A third row code may include the second message block, the fourth message block, a third zero padding block, and the sixth message block, which are encoded, and a third parity block. A fourth row code may include the third message block, the fifth message block, and the sixth message block, which are encoded, and a fourth parity block.

The message matrix may be the symmetric block-wise concatenated BCH (SBC-BCH) code, and thus the controller 120 may perform the encoding operation to the respective row codes without the encoding operation to the respective column codes of the plurality of message blocks. The controller 120 may update the plurality of encoded message blocks and the parity blocks included in the row codes in the third buffer.

At step S311, the controller 120 may generate an encoded message from the plurality of encoded message blocks and the parity blocks included in the first triangular matrix of the encoded message matrix. Since the plurality of message blocks included in the second triangular matrix are symmetrical to the plurality of message blocks included in the first triangular matrix, the controller 120 may generate the encoded message from the plurality of encoded message blocks and the parity blocks included in the first triangular matrix of the encoded message matrix. That is, the symmetric block-wise concatenated BCH (SBC-BCH) code may lower the error floor when compared with the block-wise concatenated BCH (BC-BCH) code.

Figure 4:
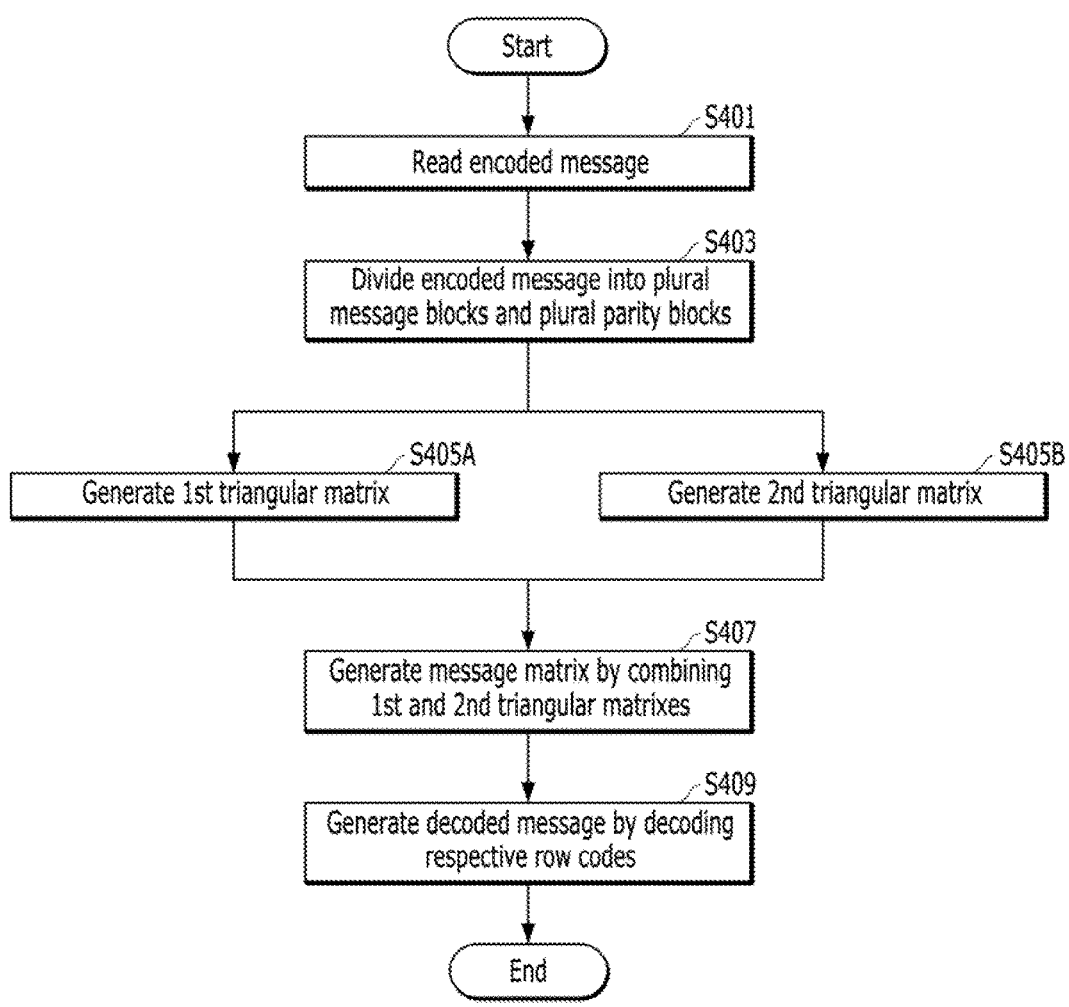
FIG. 4 is a flowchart illustrating a decoding operation of a memory system, in accordance with the first embodiment of the present invention.

FIG. 4 is a flowchart illustrating a decoding operation of a memory system in accordance with the first embodiment of the present invention. For example, the operation of FIG. 4 may be performed by the ECC unit 160 included in the controller 120 of FIG. 1.

At step S401, the controller 120 may receive a command and a message from the host 100, and may perform the read operation to the memory device 130 by reading the encoded message. At step S403, the controller 120 may divide the encoded message into a plurality of encoded message blocks and a plurality of parity blocks according to a designed code. For example, the plurality of encoded message blocks may be divided into a first encoded message block, a second encoded message block, a third encoded message block, a fourth encoded message block, a fifth encoded message block and a sixth encoded message block in sequence, and a first parity block, a second parity block, a third parity block and a fourth parity block in sequence.

At step S405A, the controller 120 may generate a first triangular matrix by using the plurality of encoded message blocks and the plurality of parity blocks. The first triangular matrix may have a stepped structure. In the first triangular matrix, the plurality of encoded message blocks and the plurality of parity blocks may be arranged in the row direction. For example, the first triangular matrix may include the first encoded message block, the second encoded message block, the third encoded message block and the first parity block in a first row code; the fourth encoded message block, the fifth encoded message block and the second parity block in a second row code; the sixth encoded message block and the third parity block in a third row code; and the fourth parity block in a fourth row code. The generated first triangular matrix may be stored in a first buffer (not shown) of the ECC unit 160.

At step S405B, the controller 120 may generate a second triangular matrix by using the plurality of encoded message blocks. The second triangular matrix may have a stepped structure. In the second triangular matrix, the plurality of encoded message blocks may be arranged in the column direction. For example, the second triangular matrix may include the first encoded message block, the second encoded message block and the third encoded message block in a first column code; the fourth encoded message block and the fifth encoded message block in a second column code; and the sixth encoded message block in a third column code. The generated second triangular matrix may be stored in a second buffer (not shown) of the ECC unit 160.

In an embodiment, the first triangular matrix and the second triangular matrix may be generated at the same time. In another embodiment, the first triangular matrix may be generated and then the second triangular matrix may be generated.

At step S407, the controller 120 may generate a single message matrix by combining the first triangular matrix and the second triangular matrix. The generated message matrix may be stored in a third buffer (not shown) of the ECC unit 160. The message matrix may have the anti-symmetric structure (e.g., FIG. 2) or the shortening structure, as described with reference to FIG. 3. The message matrix having the anti-symmetric structure may be taken as an example in this disclosure.

At step S409, the controller 120 may generate a decoded message by performing the decoding operation to the respective row codes of the encoded message matrix. That is, the controller 120 may generate the decoded message by performing the decoding operation to the plurality of encoded message blocks and the plurality of parity blocks included in the respective row codes of the encoded message matrix. Since the plurality of encoded message blocks included in the second triangular matrix are symmetrical to the plurality of encoded message blocks included in the first triangular matrix due to the symmetric block-wise concatenated BCH (SBC-BCH) code, the controller 120 may generate the decoded message from the plurality of encoded message blocks and the parity blocks included in the first triangular matrix of the encoded message matrix. The decoding operation to the respective row codes of the encoded message matrix will be described later. For example, a first decoded row code may be obtained through a first decoding operation to the first encoded row code. The first decoded row code may include a first decoded zero padding block, a first decoded message block, a second decoded message block, a third decoded message block and a first decoded parity block. A plurality of message blocks symmetrical to the first decoded row code may be updated according to the result of the first decoding operation to the first encoded row code. That is, the first encoded message block of the second encoded row code, the second encoded message block of the third encoded row code, and the third encoded message block of the fourth encoded row code, which are symmetrical to the first decoded row code, may be updated according to the result of the first decoding operation to the first encoded row code.

Then, a second decoded row code may be obtained through a second decoding operation to the second encoded row code. The second decoded row code may include a first decoded message block, a second decoded zero padding block, a fourth decoded message block, a fifth decoded message block and a second decoded parity block. A plurality of message blocks symmetrical to the second decoded row code may be updated according to the result of the second decoding operation to the second encoded row code. That is, the first encoded message block of the first encoded row code, the fourth encoded message block of the third encoded row code, and the fifth encoded message block of the fourth encoded row code, which are symmetrical to the second decoded row code, may be updated according to the result of the second decoding operation to the second encoded row code.

As described above, the controller 120 may generate the decoded message by repeatedly performing the decoding operation until the last row code of the encoded message matrix.

Figure 5:
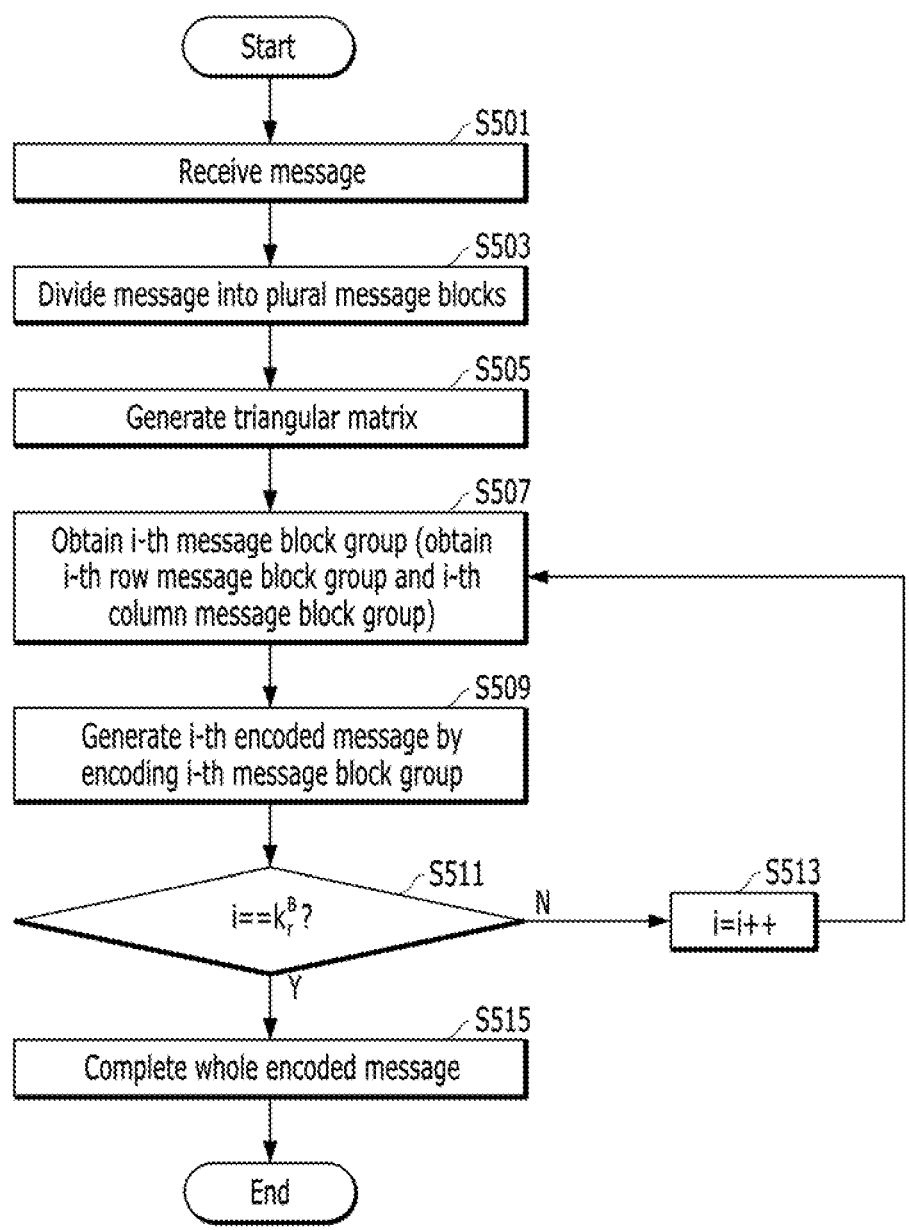
FIG. 5 is a flowchart illustrating an encoding operation of a memory system, in accordance with a second embodiment of the present invention.

FIG. 5 is a flowchart of an encoding operation of a memory system, in accordance with a second embodiment of the present invention. For example, the operation of FIG. 5 may be performed by the ECC unit 160 included in the controller 120 of FIG. 1.

At step S501, the controller 120 may receive a message from the host 100.

At step S503, the controller 120 may divide the message into a plurality of message blocks according to a designed code. For example, the controller 120 may divide the message provided from the host 100 into a first message block, a second message block, a third message block, a fourth message block, a fifth message block and a sixth message block in sequence.

At step S505, the controller 120 may generate a triangular matrix by using the plurality of message blocks. The triangular matrix may have a stepped structure. The controller 120 may generate the triangular matrix by arranging the first to sixth message blocks in the row or column direction. For example, the controller 120 may generate the triangular matrix by arranging the first to sixth message blocks in the column direction. The triangular matrix may include the first message block, the second message block and the third message block in a first column code; the fourth message block and the fifth message block in a second column code; and the sixth message block in a third column code. The generated triangular matrix may be stored in a first buffer (not shown) of the ECC unit 160.

At step S507, the controller 120 may generate an i-th message block group from the triangular matrix. The controller 120 may generate the i-th message block group from an i-th row message block group and an i-th column message block group in an i-th row code of the triangular matrix. The length "k" of the i-th message block group is $N_B \times k_r^B$ (i.e., $k = N_B \times k_r^B$). The generated i-th message block group may be stored in the row direction in a second buffer (not shown) of the ECC unit 160 and the encoding operation may be performed as described later. The size of the second buffer is $N_B \times k_r^B$, which is the same as the length "k" of the i-th message block group.

The generation of the i-th message block group from the i-th row code of the triangular matrix will be described as follows.

Firstly, the controller 120 may obtain the i-th row message block group included in the row direction in the i-th row code. Then, the controller 120 may obtain the i-th column message block group in the column direction at the location of the last message block included in the i-th row message block group of the i-th row code. Since the first message block of the i-th column message block group is the last message block of the i-th row message block group, the obtained i-th column message block group may include the other message blocks other than the first message block in the i-th column message block group.

For example, the first row message block group may include the first zero padding block. Also, the first column message block group may include the first message block, the second message block and the third message block except for the first zero padding block. That is, the first message block group may include the first zero padding block, the first message block, the second message block and the third message block.

Further, in a second message block group including a second row message block group and a second column message block group obtained from a second row code, the second row message block group may include the first message block and the second zero padding block and the second column message block group may include the fourth message block and the fifth message block. That is, the second message block group may include the first message block, the second zero padding block, the fourth message block and the fifth message block.

When the triangular matrix is generated in the row direction, the controller 120 may generate a j-th message block group by obtaining a j-th column message block group and then obtaining a j-th row message block group from a j-th column code of the triangular matrix.

At step S509, the controller 120 may generate an i-th encoded message by performing the encoding operation to the i-th message block group. The i-th encoded message may include the i-th encoded message block group and an i-th parity block corresponding to the i-th encoded message block group. For example, a first encoded message generated through the encoding operation to the first message block group may include the first encoded zero padding block, the first encoded message block, the second encoded message block, the third encoded message block and a first parity block.

At step S511, the controller 120 may determine whether the i-th row code is the last row code (i.e., $k_r^B$) of the triangular matrix.

When the i-th row code is not the last row code of the triangular matrix as a result of step S511, the controller 120 may increase the index "i" (i.e., i=i++) of the i-th row code at step S513 and may repeat steps S507 to S513 until the i-th row code is the last row code corresponding to the predetermined number (i.e., $k_r^B$) of the row codes in the triangular matrix in order to generate a plurality of encoded messages corresponding to the respective row codes.

When the i-th row code is the last row code of the triangular matrix as a result of step S511, the controller 120 may generate whole encoded message based on the plurality of encoded messages corresponding to the respective row codes at step S515.

Figure 6:
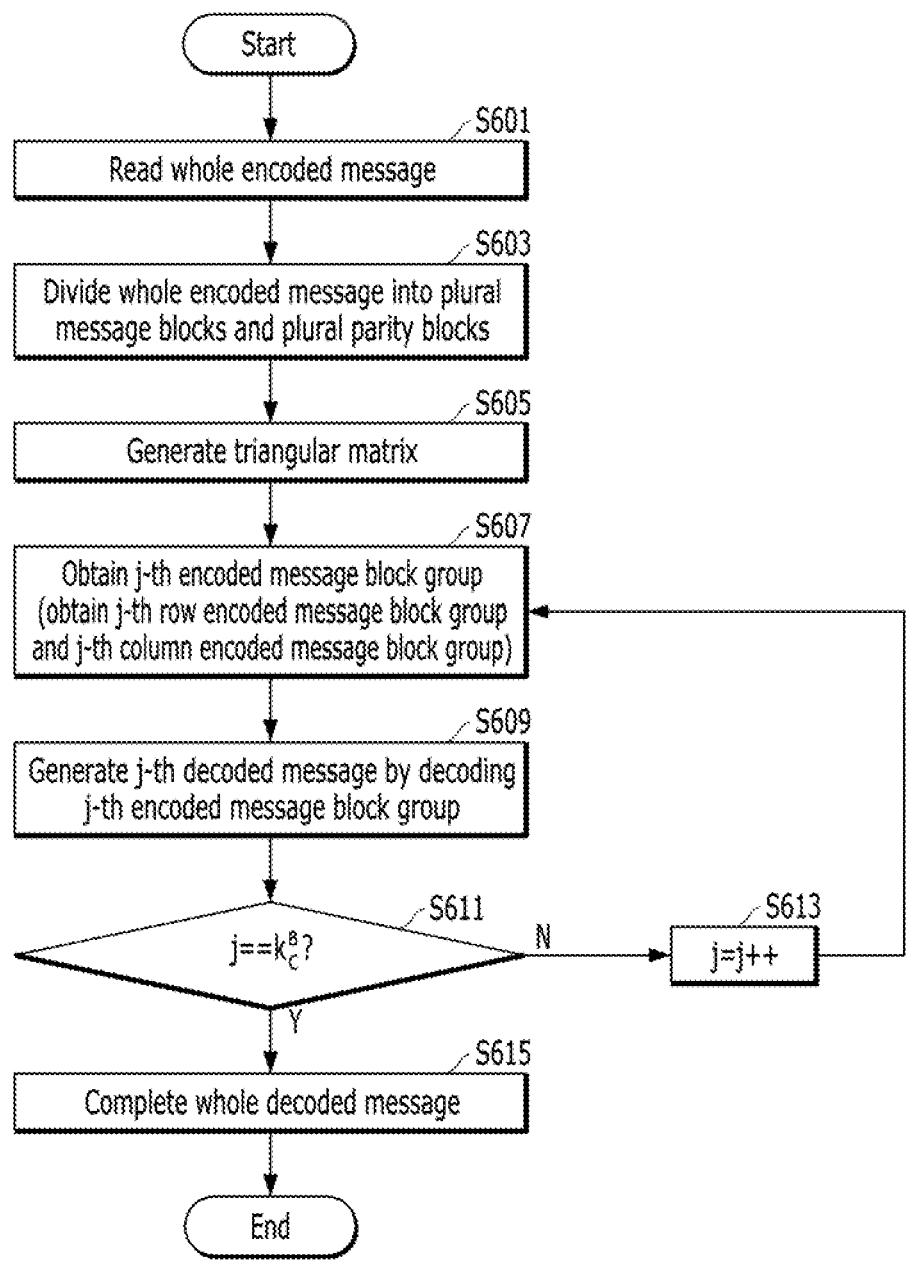
FIG. 6 is a flowchart illustrating a decoding operation of a memory system, in accordance with the second embodiment of the present invention.

FIG. 6 is a flowchart illustrating a decoding operation of a memory system in accordance with the second embodiment of the present invention. For example, the operation of FIG. 6 may be performed by the ECC unit 160 included in the controller 120 of FIG. 1.

At step S601, the controller 120 may receive a command and a message from the host 100, and may perform the read operation to the memory device 130 by reading the whole encoded message. At step S603, the controller 120 may divide the whole encoded message into a plurality of encoded message blocks and a plurality of parity blocks according to a designed code. For example, the plurality of encoded message blocks may be divided into a first encoded message block, a second encoded message block, a third encoded message block, a fourth encoded message block, a fifth encoded message block and a sixth encoded message block in sequence; and a first parity block, a second parity block, a third parity block and a fourth parity block in sequence.

At step S605, the controller 120 may generate a triangular matrix by using the plurality of encoded message blocks and the plurality of encoded parity blocks. The triangular matrix may have a stepped structure. In the triangular matrix, the plurality of encoded message blocks and the plurality of parity blocks may be arranged in the row direction. The generated first triangular matrix may be stored in a first buffer (not shown) of the ECC unit 160. The triangular matrix may include a plurality of zero padding blocks arranged in the diagonal direction, or may not include the plurality of zero padding blocks arranged in the diagonal direction. For example, the triangular matrix may include a plurality of zero padding blocks arranged in the diagonal direction.

For example, the triangular matrix may include a first zero padding block, the first encoded message block, the second encoded message block, the third encoded message block and the first parity block in a first row code; a second zero padding block, the fourth encoded message block, the fifth encoded message block and the second parity block in a second row code; a third zero padding block, the sixth encoded message block and the third parity block in a third row code; and a fourth zero padding block and the fourth parity block in a fourth row code.

At step S607, the controller 120 may generate a j-th encoded message block group from the triangular matrix by using the symmetric block-wise concatenated BCH (SBC-BCH) code of the triangular matrix. The controller 120 may generate the j-th encoded message block group by obtaining a j-th column encoded message block group and a J-th row encoded message block group. The j-th encoded message block group may include a plurality of encoded message blocks, a single parity block and a single zero padding block. The length "k" of the j-th encoded message block group is $N_B \times k_c^B + N_P$ (i.e., $k = N_B \times k_c^B + N_P$), where $k_c^B$ represents a number of row codes each including the plurality of encoded message blocks and a single zero padding block and $N_P$ represents the parity block. The generated j-th encoded message block group may be stored in the row direction in a second buffer (not shown) of the ECC unit 160. The generation of the j-th encoded message block group from the triangular matrix will be described as follows.

Firstly, the controller 120 may obtain the j-th column encoded message block group included in the column direction in the j-th column code. Then, the controller 120 may obtain the j-th row encoded message block group in the row direction at the location of the last encoded message block included in the j-th column encoded message block group of the j-th column code. Then, the controller 120 may generate the j-th encoded message block group from the j-th column encoded message block group and the j-th row encoded message block group. Since the first encoded message block of the j-th row encoded message block group is the last encoded message block of the j-th column encoded message block group, the obtained j-th row encoded message block group may include the other encoded message blocks other than the first encoded message block in the j-th row encoded message block group. For example, the first column encoded message block may include the first encoded zero padding block. Also, the first row encoded message block group may include the first encoded message block, the second encoded message block, the third encoded message block and the first parity block except for the first encoded zero padding block. That is, the first encoded message block group may include the first encoded zero padding block, the first encoded message block, the second encoded message block, the third encoded message block and the first parity block.

At step S609, the controller 120 may generate a j-th decoded message block group by performing the decoding operation to the j-th encoded message block group. The controller 120 may update the i-th encoded message block group, which is stored in the first buffer, into the j-th decoded message block group. For example, the first decoded message block group, which is generated through the decoding operation to the first encoded message block group, may include the first decoded zero padding block, the first decoded message block, the second decoded message block, the third decoded message block, and the first decoded parity block.

At step S611, the controller 120 may determine whether the j-th column code is the last column code (i.e., $k_c^B$).

When the j-th column code is not the last column code of the triangular matrix as a result of step S611, the controller 120 may increase the index "j" (i.e., j=i++) of the j-th column code at step S613 and may repeat steps S607 to S613 until the j-th column code is the last column code corresponding to the predetermined number (i.e., $k_c^B$) of the column codes in the triangular matrix in order to generate a plurality of decoded message block groups corresponding to the respective column codes.

When the j-th column code is the last column code of the triangular matrix as a result of step S611, the controller 120 may generate whole decoded message based on the plurality of decoded message block groups corresponding to the respective column codes at step S615.

Figure 7:
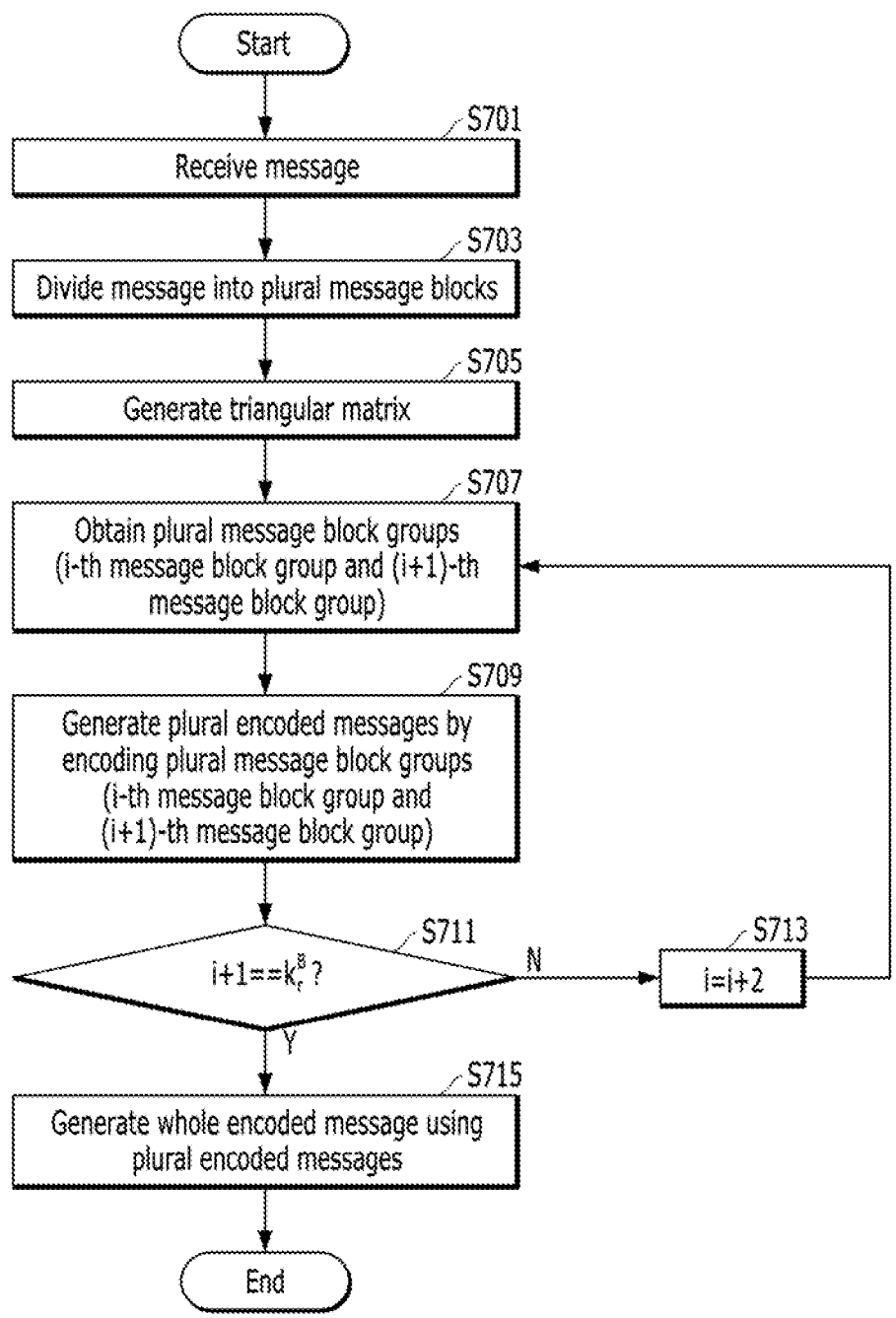
FIG. 7 is a flowchart illustrating an encoding operation of a memory system, in accordance with a third embodiment of the present invention.

FIG. 7 is a flowchart of an encoding operation of a memory system in accordance with a third embodiment of the present invention. For example, the operation of FIG. 7 may be performed by the ECC unit 160 included in the controller 120 of FIG. 1.

At step S701, the controller 120 may receive a message from the host 100.

At step S703, the controller 120 may divide the message into a plurality of message blocks according to a designed code. For example, the controller 120 may divide the message provided from the host 100 into a first message block, a second message block, a third message block, a fourth message block, a fifth message block and a sixth message block in sequence.

At step S705, the controller 120 may generate a triangular matrix by using the plurality of message blocks. The triangular matrix may have a stepped structure. The controller 120 may generate the triangular matrix by arranging the first to sixth message blocks in the row or column direction. For example, the controller 120 may generate the triangular matrix by arranging the first to sixth message blocks in the column direction. The generated triangular matrix may be stored in a first buffer (not shown) of the ECC unit 160. The triangular matrix may include a plurality of zero padding blocks arranged in the diagonal direction, or may not include the plurality of zero padding blocks arranged in the diagonal direction. For example, the triangular matrix may include a plurality of zero padding blocks arranged in the diagonal direction. The triangular matrix may include a first zero padding block, the first message block, the second message block and the third message block in a first column code; a second zero padding block, the fourth message block and the fifth message block in a second column code; a third zero padding block and the sixth message block in a third column code; and a fourth zero padding block in a fourth column code.

At step S707, the controller 120 may generate plurality of message block groups from the triangular matrix. The plurality of message block groups may include an i-th message block group and an (i+1)-th message block group. The controller 120 may generate the i-th message block group from an i-th row message block group and an i-th column message block group in an i-th row code of the triangular matrix. The controller 120 may generate the (i+1)-th message block group from an (i+1)-th row message block group and an (i+1)-th column message block group in an (i+1)-th row code of the triangular matrix. Each length "k" of the plurality of message block groups is $N_B \times k_r^B$ (i.e., $k = N_B \times k_r^B$). The generated plurality of message block groups may be stored in the row direction in a second buffer (not shown) of the ECC unit 160. The size of the second buffer is $(N_B \times k_r^B) \times n_P$, where $n_P$ represents a number of the plurality of message block groups to be encoded.

The generation of the plurality of message block groups from the triangular matrix will be described as follows.

Firstly, the controller 120 may obtain the i-th row message block group included in the row direction in the i-th row code. Then, the controller 120 may obtain the i-th column message block group in the column direction at the location of the last message block included in the i-th row message block group of the i-th row code. Then, the controller 120 may generate the i-th message block group based on the obtained i-th row message block group and the obtained i-th column message block group. The obtained i-th column message block group may include a plurality of message blocks, which are in column direction, next to the last message block of the i-th row message block group. The generated i-th message block group may be stored in the second buffer. For example, the first message block group may include the first row message block and the first column message block. The first row message block may include the first zero padding block. Also, the first column message block group may include the first message block, the second message block and the third message block except for the first zero padding block. That is, the first message block group may include the first zero padding block, the first message block, the second message block and the third message block.

Then, the controller 120 may generate the (i+1)-th message block group in the same way as the i-th message block group described above, and store in the second buffer. For example, a second message block group may include a second row message block group and a second column message block group obtained from a second row code. The second row message block group may include the first message block and the second zero padding block and the second column message block group may include the fourth message block and the fifth message block. That is, the second message block group may include the first message block, the second zero padding block, the fourth message block and the fifth message block.

At step S709, the controller 120 may generate a plurality of encoded message block groups by simultaneously performing the encoding operation to the plurality of message block groups. The plurality of encoded message block groups may include an i-th encoded message block group and an (i+1)-th encoded message block group.

The i-th encoded message block group may include the i-th encoded message block group and an i-th parity block corresponding to the i-th encoded message block group. Also, the (i+1)-th encoded message block group may include the (i+1)-th encoded message block group and an (i+1)-th parity block corresponding to the (i+1)-th encoded message block group. For example, a first encoded message block group may include the first encoded zero padding block, the first encoded message block, the second encoded message block, the third encoded message block and a first parity block. A second encoded message block group may include the first encoded message block, the second encoded zero padding block, the fourth encoded message block, the fifth encoded message block and a second parity block.

At step S711, the controller 120 may determine whether the (i+1)-th row code is the last row code (i.e., $k_r^B$) of the triangular matrix.

When the (i+1)-th row code is not the last row code of the triangular matrix as a result of step S711, the controller 120 may increase the index "i+1" (i.e., i=i+2) and the i-th row code at step S713 and may repeat steps S707 to S713 until the (i+1)-th row code is the last row code corresponding to the predetermined number (i.e., $k_r^B$) of the row codes in the triangular matrix in order to generate a plurality of encoded messages corresponding to the respective row codes.

When the (I+1)-th row code is the last row code of the triangular matrix as a result of step S711, the controller 120 may generate whole encoded message based on the plurality of encoded message block groups corresponding to the respective row codes at step S715.

Figure 8:
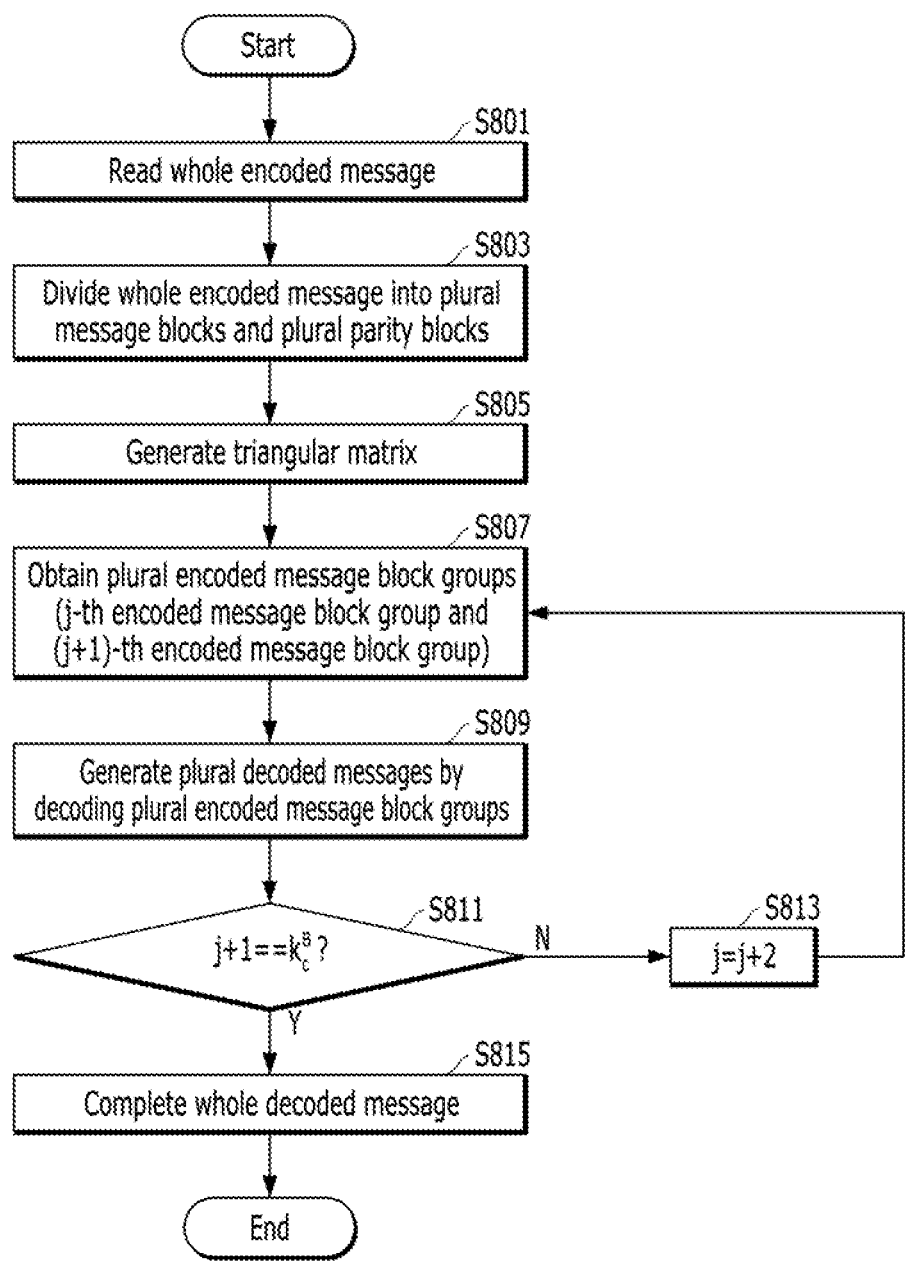
FIG. 8 is a flowchart illustrating a decoding operation of a memory system, in accordance with the third embodiment of the present invention.

FIG. 8 is a flowchart of a decoding operation of a memory system, in accordance with the third embodiment of the present invention. For example, the operation of FIG. 8 may be performed by the ECC unit 160 included in the controller 120 of FIG. 1.

At step S801, the controller 120 may receive a command and a message from the host 100, and may perform the read operation to the memory device 130 by reading the whole encoded message. At step S803, the controller 120 may divide the whole encoded message into a plurality of encoded message blocks and a plurality of parity blocks according to a designed code. For example, the plurality of encoded message blocks may be divided into a first encoded message block, a second encoded message block, a third encoded message block, a fourth encoded message block, a fifth encoded message block and a sixth encoded message block in sequence; and a first parity block, a second parity block, a third parity block and a fourth parity block in sequence.

At step S805, the controller 120 may generate a triangular matrix by using the plurality of encoded message blocks and the plurality of encoded parity blocks. The triangular matrix may have a stepped structure. In the triangular matrix, the plurality of encoded message blocks and the plurality of parity blocks may be arranged in the row direction. The triangular matrix may include a plurality of zero padding blocks arranged in the diagonal direction, or may not include the plurality of zero padding blocks arranged in the diagonal direction. For example, the triangular matrix may include a plurality of zero padding blocks arranged in the diagonal direction. The generated first triangular matrix may be stored in a first buffer (not shown) of the ECC unit 160. For example, the triangular matrix may include a first zero padding block, the first encoded message block, the encoded second message block, the third encoded message block and a first parity block in a first row code; a second zero padding block, the fourth encoded message block, the fifth encoded message block and a second parity block in a second row code; a third zero padding block, the sixth encoded message block and a third parity block in a third row code; and a fourth zero padding block and a fourth parity block in a fourth row code.

At step S807, the controller 120 may generate a plurality of encoded message block groups from the triangular matrix by using the symmetric block-wise concatenated BCH (SBC-BCH) code of the triangular matrix. The plurality of encoded message block groups may include a j-th encoded message block group and a (j+1)-th encoded message block group. The controller 120 may generate the j-th encoded message block group by obtaining a j-th column encoded message block group and a J-th row encoded message block group. The controller 120 may generate the (J+1)-th encoded message block group by obtaining a (J+1)-th column encoded message block group and a (j+1)-th row encoded message block group. Each length "k" of the plurality of encoded message block groups is $(N_B \times k_c^B) + N_P$ (i.e., $k=(N_B \times k_c^B) + N_P$), where $N_P$ represents a size of the parity block. The generated plurality of encoded message block groups may be stored in the row direction in a second buffer (not shown) of the ECC unit 160. A size of the second buffer may be $((N_B \times k_c^B) + N_P) \times n_P$, where $n_P$ represents a number of the plurality of encoded message block groups to be decoded.

The generation of the plurality of encoded message block groups from the triangular matrix will be described as follows.

Firstly, the controller 120 may obtain the j-th column encoded message block group included in the column direction in the j-th column code. Then, the controller 120 may obtain the j-th row encoded message block group in the row direction at the location of the last encoded message block included in the j-th column encoded message block group of the j-th column code. Then, the controller 120 may generate the j-th encoded message block group from the j-th column encoded message block group and the j-th row encoded message block group. Since the first encoded message block of the j-th row encoded message block group is the last encoded message block of the j-th column encoded message block group, the obtained J-th row encoded message block group may include the other encoded message blocks other than the first encoded message block in the j-th row encoded message block group. The obtained j-th encoded message block group may be stored in the second buffer. Then, the controller 120 may generate the (J+1)-th encoded message block group in the same way as the j-th encoded message block group described above, and store in the second buffer.

For example, a first encoded message block group may include a first column encoded message block group and a first row encoded message block group. The first column encoded message block may include the first encoded zero padding block. Also, the first row encoded message block group may include the first encoded message block, the second encoded message block, the third encoded message block and the first parity block except for the first encoded zero padding block. That is, the first encoded message block group may include the first encoded zero padding block, the first encoded message block, the second encoded message block, the third encoded message block and the first parity block.

Also, a second encoded message block group may include a second column encoded message block group and a second row encoded message block group. The second column encoded message block may include the first encoded zero padding block and a second encoded zero padding block. Also, the second row encoded message block group may include the fourth encoded message block, the fifth encoded message block and a second parity block. That is, the second encoded message block group may include the first encoded message block, the second encoded zero padding block, the fourth encoded message block, the fifth encoded message block and the second parity block.

At step S809, the controller 120 may generate a plurality of decoded message block groups by simultaneously performing the decoding operation to the plurality of encoded message block groups. The plurality of decoded message block groups may include a J-th decoded message block group and a (j+1)-th decoded message block group. The controller 120 may update the i-th encoded message block group and the (i+1)-th encoded message block group, which are stored in the first buffer, into the j-th decoded message block group and the (J+1)-th decoded message block group. For example, the first decoded message block group may include the first decoded zero padding block, the first decoded message block, the second decoded message block, the third decoded message block, and the first decoded parity block. Also the second decoded message block group may include the first decoded message block, the second decoded zero padding block, the fourth decoded message block, the fifth decoded message block, and the second decoded parity block.

At step S811, the controller 120 may determine whether the (J+1)-th column code is the last column code (i.e., kg).

When the (j+1)-th column code is not the last column code of the triangular matrix as a result of step S811, the controller 120 may increase the index "j+1" (i.e., j=i+2) and the j-th column code at step S813 and may repeat steps S807 to S813 until the (J+1)-th column code is the last column code corresponding to the predetermined number (i.e., $k_c^B$) of the column codes in the triangular matrix in order to generate a plurality of decoded message block groups corresponding to the respective column codes and update the first buffer.

When the (j+1)-th column code is the last column code of the triangular matrix as a result of step S811, the controller 120 may generate whole decoded message based on the plurality of decoded message block groups corresponding to the respective column codes, at step S815.

Figure 9:
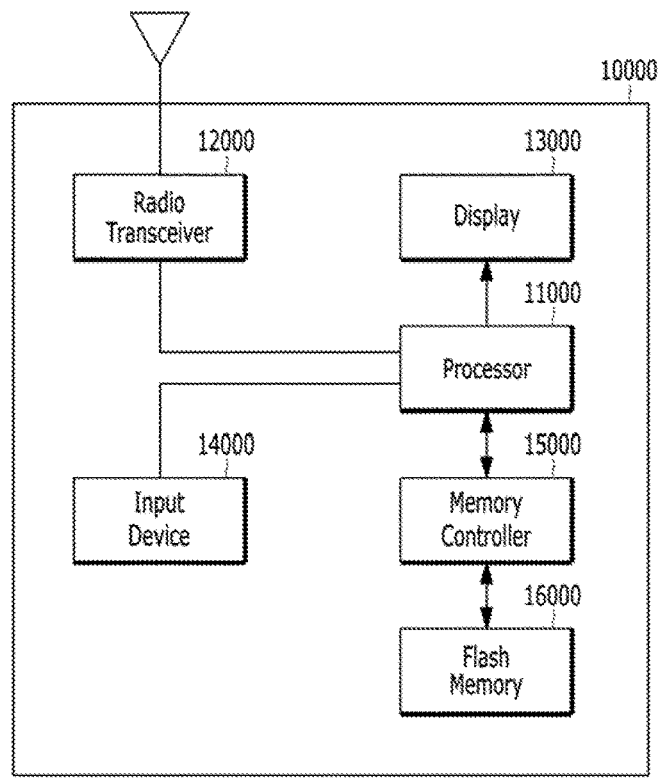
FIG. 9 is a block diagram illustrating an electronic device including a semiconductor memory system, in accordance with an embodiment of the present invention.

FIG. 9 illustrates an electronic device 10000 including a memory controller 15000 and a flash memory 16000, according to an embodiment of the present invention. The electronic device 10000 may be or include, for example, a cellular phone, a smart phone, or a tablet PC.

According to the embodiment of FIG. 9, the electronic device 10000 may include the flash memory 16000 implemented by a flash memory device and the memory controller 15000 for controlling the flash memory 16000. The flash memory 16000 may correspond to the memory system 110 described above with reference to FIGS. 12 to 19. The flash memory 16000 may store random data. The memory controller 15000 may be controlled by a processor 11000 which controls overall operations of the electronic device 10000.

Data stored in the flash memory 16000 may be displayed through a display 13000 under the control of the memory controller 15000. The memory controller 15000 may operate under the control of the processor 11000.

A radio transceiver 12000 may receive and output a radio signal through an antenna (ANT). For example, the radio transceiver 12000 may convert the radio signal received from the antenna into a signal which will be processed by the processor 11000. Thus, the processor 11000 may process the signal converted by the radio transceiver 12000, and may store the processed signal at the flash memory 16000. The processor 11000 may display the processed signal through the display 13000.

The radio transceiver 12000 may convert a signal from the processor 11000 into a radio signal, and may output the converted radio signal externally through the antenna.

An input device 14000 may receive a control signal for controlling an operation of the processor 11000 or data to be processed by the processor 11000. The input device 14000 may be or include a pointing device, such as a touch pad, a computer mouse, a key pad, and a keyboard.

The processor 11000 may control the display 13000 so that data from the flash memory 16000, the radio signal from the radio transceiver 12000, or the data from the input device 14000 is displayed through the display 13000.

Figure 10:
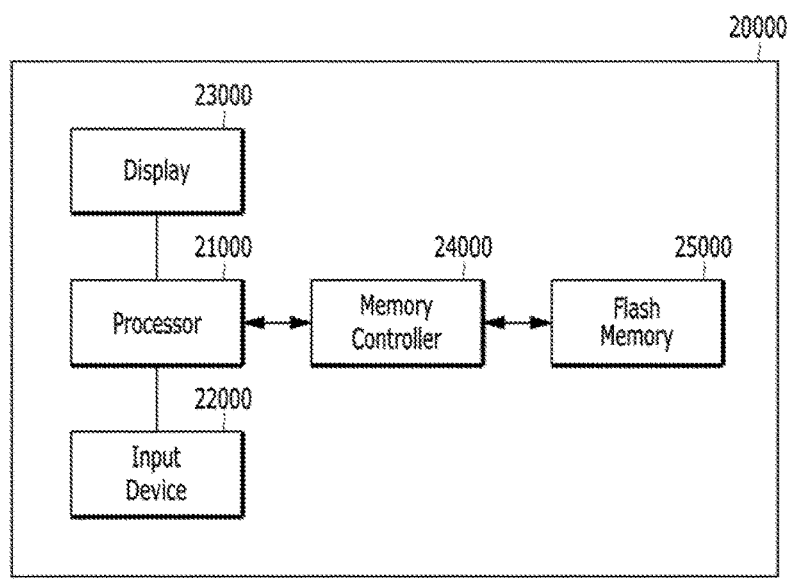
FIG. 10 is a block diagram illustrating an electronic device including a semiconductor memory system, in accordance with another embodiment of the present invention.

FIG. 10 illustrates an electronic device 20000 including a memory controller 24000 and a flash memory 25000, according to an embodiment of the present invention.

According to the embodiment of FIG. 10, the electronic device 20000 may be implemented by a data processing device, such as a personal computer (PC), a tablet computer, a net-book, an e-reader, a personal digital assistant (PDA), a portable multimedia player (PMP), an MP3 player, and an MP4 player, and may include the flash memory 25000 as a memory device, and the memory controller 24000 to control an operation of the flash memory 25000.

The electronic device 20000 may include a processor 21000 to control overall operations of the electronic device 20000. The memory controller 24000 may be controlled by the processor 21000.

The processor 21000 may display data stored in the flash memory 25000 through a display 23000 in response to an input signal from an input device 22000. For example, the input device 22000 may be implemented by a pointing device such as a touch pad, a computer mouse, a key pad, and a keyboard.

Figure 11:
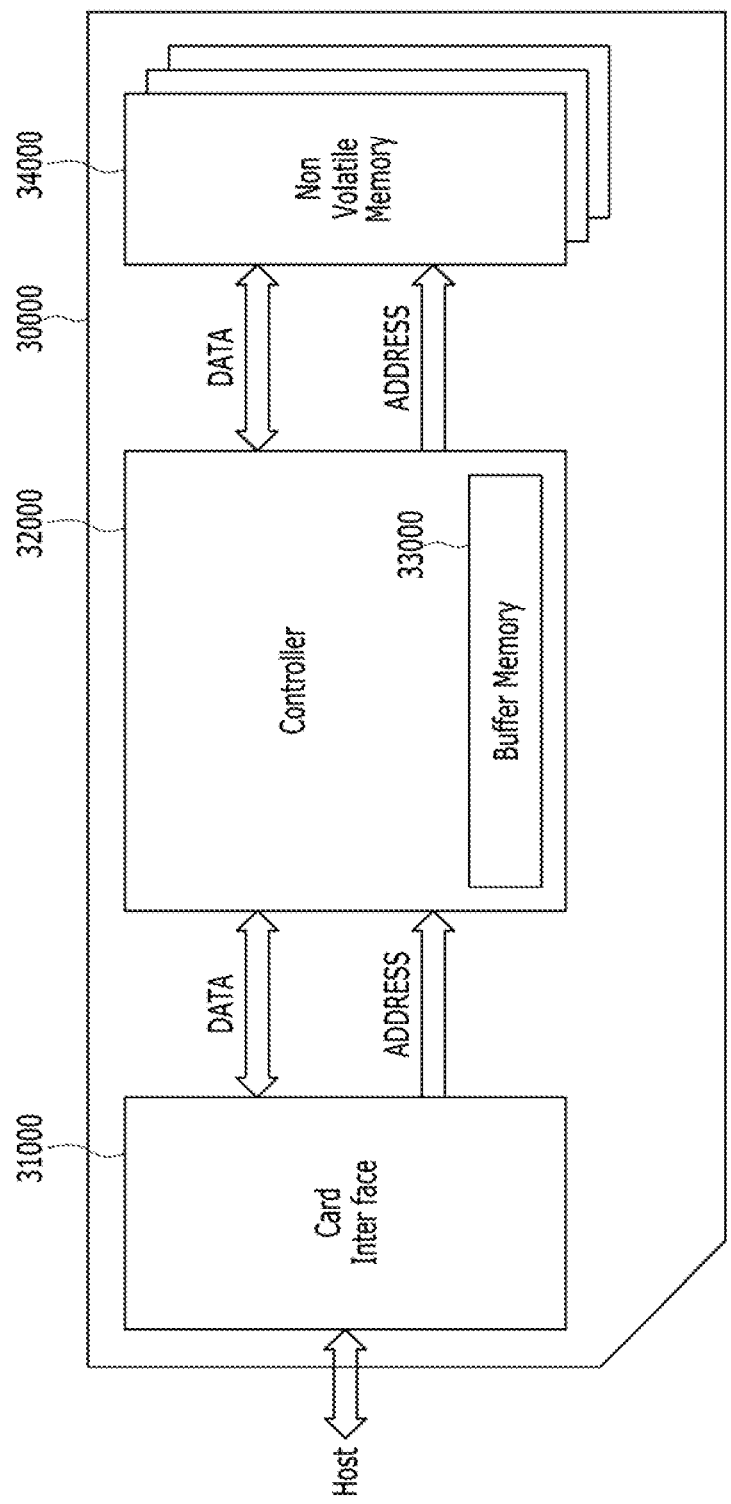
FIG. 11 is a block diagram illustrating an electronic device including a semiconductor memory system, in accordance with yet another embodiment of the present invention.

FIG. 11 illustrates an electronic device 30000 including a controller 32000 and a non-volatile memory 34000, according to an embodiment of the present invention.

Referring to FIG. 11, the electronic device 30000 may include a card interface 31000, the controller 32000, and the non-volatile memory 34000 (e.g., a flash memory device).

The electronic device 30000 may exchange data with a host through the card interface 31000. The card interface 31000 may be a secure digital (SD) card interface or a multi-media card (MMC) interface, which does not limit the scope of the present invention. The card interface 31000 may interface the host and the controller 32000 according to a communication protocol of the host that is capable of communicating with the electronic device 30000.

The controller 32000 may control the overall operations of the electronic device 30000, and may control data exchange between the card interface 31000 and the non-volatile memory 34000. A buffer memory 33000 of the controller 32000 may buffer data transferred between the card interface 31000 and the non-volatile memory 34000.

The controller 32000 may be coupled with the card interface 31000 and the non-volatile memory 34000 through a data bus DATA and an address bus ADDRESS. According to an embodiment, the controller 32000 may receive an address of data, which is to be read or written, from the card interface 31000 through the address bus ADDRESS, and may send it to the non-volatile memory 34000. Further, the controller 32000 may receive or transfer data to be read or written through the data bus DATA connected with the card interface 31000 or the non-volatile memory 34000.

When the electronic device 30000 is connected with the host such as a PC, a tablet PC, a digital camera, a digital audio player, a mobile phone, console video game hardware, and a digital set-top box, the host may exchange data with the non-volatile memory 34000 through the card interface 31000 and the controller 32000.

While the present invention has been described with respect to the specific embodiments, it will be apparent to those skilled in the art that various changes and modifications may be made without departing from the spirit and scope of the invention as defined in the following claims.

Also, in some instances, as would be apparent to those skilled in the relevant art, a feature or element described in connection with one embodiment may be used singly or in combination with other features or elements of another embodiment, unless otherwise specifically indicated.

What is claimed is:

1. A memory system comprising:
a memory device; and
a controller including an ECC circuit and coupled with the memory device, wherein the controller is configured to receive a message in response to a request from a host, generate a message matrix by the ECC circuit into at least one buffer of the ECC circuit, including predetermined row codes and predetermined column codes symmetrical to the predetermined row codes in accordance with the received message, wherein the message matrix includes a first triangular matrix and a second triangular matrix symmetrical to the first triangular matrix, encode the message matrix by the ECC circuit using a block-wise concatenated Bose-Chadhuri-Hocquenghem (BCH) code with a symmetrical structure, and store the encoded message by the ECC circuit into the memory device, and decode the encoded message by the ECC circuit using a block-wise concatenated BCH code with a symmetrical structure.

2. The memory system of claim 1, wherein the ECC circuit is configured to divide the message into a plurality of message blocks.

3. The memory system of claim 1, wherein the ECC circuit is configured to divide the encoded message into a plurality of encoded message blocks and a plurality of parity blocks.

4. The memory system of claim 1, wherein the first triangular matrix is generated using the plurality of message blocks.

5. The memory system of claim 4, wherein the second triangular matrix is generated using the plurality of message blocks so that the second triangular matrix is symmetrical to the first triangular matrix.

6. The memory system of claim 1, wherein the first triangular matrix is generated using the plurality of encoded message blocks and the plurality of parity blocks.

7. The memory system of claim 6, wherein the second triangular matrix is generated using the plurality of encoded message blocks so that the second triangular matrix is symmetrical to the plurality of encoded message blocks of the first triangular matrix.

8. An operation method of a controller in a memory system including a host, the controller and a memory device coupled with the controller, the operation method comprising:

receiving a message from the host into the controller;
dividing the received message into a plurality of message blocks by an ECC circuit of the controller;
generating by the ECC circuit into at least one buffer of the ECC circuit, a first triangular matrix and a second triangular matrix symmetrical to the first triangular matrix using the plurality of message blocks;
generating a message matrix by the ECC circuit by combining the first triangular matrix and the second triangular matrix;
performing an encoding operation to the message matrix by the ECC circuit; and
generating an encoded message by the ECC circuit by obtaining the first triangular matrix and a plurality of parity blocks from the encoded message matrix.

9. The operation method of claim 8, wherein the message matrix includes a block-wise concatenated Bose-Chadhuri-Hocquenghem (BCH) code, and includes predetermined row codes and predetermined column codes symmetrical to the predetermined row codes.

10. The operation method of claim 8, wherein the message matrix has an anti-symmetric structure where a plurality of zero padding blocks are included between the first triangular matrix and the second triangular matrix.

11. The operation method of claim 8, wherein the message matrix has a shortening structure where a plurality of zero padding blocks are not included between the first triangular matrix and the second triangular matrix.

12. The operation method of claim 8, wherein the encoding operation is performed to respective row codes of the message matrix to generate a parity block corresponding to the respective row codes.

13. The operation method of claim 8, wherein the second triangular matrix is symmetrical to the first triangular matrix in the encoded message matrix.

14. The operation method of claim 8, further comprising: storing the encoded message in the memory device.

15. An operation method of a controller in a memory system including a host, the controller and a memory device coupled with the controller, the operation method comprising:

reading an encoded message from the memory device into the controller;
dividing the encoded message into a plurality of encoded message blocks and a plurality of parity blocks by an ECC circuit of the controller;
generating by the ECC circuit into at least one buffer of the ECC circuit, a first triangular matrix and a second triangular matrix symmetrical to the first triangular matrix using the plurality of encoded message blocks and the plurality of parity blocks;
generating a message matrix by the ECC circuit by combining the first triangular matrix and the second triangular matrix;
performing a decoding operation to the message matrix by the ECC circuit; and
generating a decoded message by the ECC circuit by obtaining the first triangular matrix from the decoded message matrix.

16. The operation method of claim 15, wherein the message matrix includes a block-wise concatenated Bose-Chadhuri-Hocquenghem (BCH) code, and includes predetermined row codes and predetermined column codes symmetrical to the predetermined row codes.

17. The operation method of claim 15, wherein the message matrix has an anti-symmetric structure where a plurality of zero padding blocks are included between the first triangular matrix and the second triangular matrix.

18. The operation method of claim 15, wherein the message matrix has a shortening structure where a plurality of zero padding blocks are not included between the first triangular matrix and the second triangular matrix.

19. The operation method of claim 15, wherein performing the decoding operation to the message matrix includes:

generating a first decoding result by performing the decoding operation to a first row code of the message matrix;
updating a first column code, which is symmetrical to the first row code, by transmitting the first decoding result to the first column code; and
repeating the generating of the first decoding result and the updating the first column code a predetermined number of times until the first row code in the message matrix becomes a last row code.

* * * * *